(12) United States Patent
Zhao et al.

(10) Patent No.: US 11,594,296 B2
(45) Date of Patent: Feb. 28, 2023

(54) MEMORY CONTROLLER PHYSICAL INTERFACE WITH DIFFERENTIAL LOOPBACK TESTING

(71) Applicant: Innogrit Technologies Co., Ltd., Shanghai (CN)

(72) Inventors: Gang Zhao, Chandler, AZ (US); Wei Jiang, Fremont, CA (US); Kangmin Hu, Santa Clara, CA (US); Lin Chen, Cupertino, CA (US)

(73) Assignee: INNOGRIT TECHNOLOGIES CO., LTD., Shanghai (CN)

( * ) Notice: Subject to any disclaimer, the term of this patent is extended or adjusted under 35 U.S.C. 154(b) by 36 days.

(21) Appl. No.: 17/205,046

(22) Filed: Mar. 18, 2021

(65) Prior Publication Data

US 2022/0301651 A1    Sep. 22, 2022

(51) Int. Cl.
*G11C 29/38* (2006.01)
*H04L 25/03* (2006.01)

(52) U.S. Cl.
CPC ........ *G11C 29/38* (2013.01); *H04L 25/03057* (2013.01)

(58) Field of Classification Search
None
See application file for complete search history.

(56) References Cited

U.S. PATENT DOCUMENTS

| | | | |
|---|---|---|---|
| 10,496,309 B2 * | 12/2019 | Eugenio | G06F 13/1689 |
| 10,826,502 B1 * | 11/2020 | Badizadegan | H03L 7/085 |
| 2008/0204096 A1 * | 8/2008 | Agarwal | H03K 5/151 327/171 |
| 2009/0172215 A1 * | 7/2009 | Rashid | G06F 13/4059 710/33 |
| 2019/0293709 A1 * | 9/2019 | Lin | G06F 3/0679 |
| 2020/0025824 A1 | 1/2020 | Zhao et al. | |
| 2020/0333396 A1 | 10/2020 | Zhao et al. | |

* cited by examiner

*Primary Examiner* — Cynthia Britt
*Assistant Examiner* — Matthew W Wahlin
(74) *Attorney, Agent, or Firm* — IPro, PLLC

(57) ABSTRACT

Systems, apparatus and methods are provided for loopback testing techniques for memory controllers. A memory controller that may comprise loopback testing circuitry that may comprise a first multiplexer having a first input coupled to an output of an input buffer and a second input coupled to a first data output from the memory controller, an inverter coupled to the output of the input buffer, and a second multiplexer having a first input coupled to an output of the inverter and a second input coupled to a second data output from the memory controller.

19 Claims, 2 Drawing Sheets

MEMORY CONTROLLER PHYSICAL INTERFACE WITH DIFFERENTIAL LOOPBACK TESTING

TECHNICAL FIELD

The disclosure herein relates to the memory controller interface, particularly relates to the electrical testing circuit and method for a DDR5 controller Phy within system on chip (SoC) applications.

BACKGROUND

The rapid growth in data center, cloud computing and artificial intelligence applications have spurred increasing demand for memory bandwidth and double data rate (DDR) interface speed in recent years. In 2018, the first generation of commercial double data rate type six synchronous graphics random-access memory (GDDR6) devices for computer-based systems increased the speed of memory devices to 10~14 Gb/s from 8 Gb/s. The introduction of DDR5 specifications in late 2019 has revolutionized the computation world with faster, higher-capacity and more powerful DDR5 DRAM devices. In order to support the higher speed of DDR5 DRAM devices at up to 6400 MT/s, a set of new features have been introduced including the decision feedback equalizer (DFE) and internal VREFCA.

Although the new loopback testing capability are only mandatory for the DDR5 DRAM device, some DDR5 controllers have also taken advantage of the new protocol and implemented a similar loopback feature in the DDR5 controller Phy. However, the existing DDR5 loopback feature is purposely designed and curtailed for the DRAM device with maximum simplification and friendly implementation, but is not optimized for the DDR5 controller Phy in terms of performance and reliability. First, the output testing signals are single-ended signals which greatly reduces the speed performance and reliability of high-speed transmission through a testing channel. As a result, the testing speed is reduced to a half or a quarter of the incoming traffic and only a portion of the received data signal is looped back for comparison. Second, the existing loopback scheme can only test the receiver circuit and the DFE circuit, but not the Read FIFO circuit and the entire transmitter circuit of the DDR5 controller Phy. Therefore, there is a need in the art for a better scheme that provides maximum speed performance and reliability and also achieves a more complete coverage including the Read FIFO and the transmitter circuits.

SUMMARY

The present disclosure provides systems and methods for loopback testing of memory controllers. In various embodiments, a memory controller with a double data rate (DDR) interface may include a loopback testing circuit. The loopback testing circuit may include two data paths. A first data path may loop back a received data signal (DQ signal) after the DQ signal passes through an input buffer (e.g., read first-in-first-out (FIFO) buffer). The first data path may include a first multiplexer coupled to an output of the input buffer so the DQ signal may be multiplexed with a data output from the memory controller. From the first multiplexer the DQ signal may be sent to a first output buffer (e.g., write FIFO buffer). A second data path may include an inverter coupled to the output of the input buffer to invert the DQ signal and pass the inverted DQ signal to a second multiplexer, where the inverted DQ signal may be multiplexed with another data output from the memory controller. From the second multiplexer the inverted DQ may then be sent to a second output buffer. The looped back DQ signal and the inverted DQ signal may be transmitted by two output drivers of the memory controller interface in the form of a full differential signal (e.g., to an external test instrument). In some embodiments, the memory controller may be a DDR5 controller within a system on chip (SoC).

In an exemplary embodiment, there is provided a memory controller that may comprise loopback testing circuitry. The loopback testing circuitry may comprise a first multiplexer having a first input coupled to an output of an input buffer and a second input coupled to a first data output from the memory controller, an inverter coupled to the output of the input buffer and a second multiplexer having a first input coupled to an output of the inverter and a second input coupled to a second data output from the memory controller.

In another exemplary embodiment, there is provided a physical interface for a memory controller. The physical interface may comprise loopback testing circuitry that may comprise a first multiplexer having a first input coupled to an output of an input buffer and a second input coupled to a first data output from the memory controller, an inverter coupled to the output of the input buffer, and a second multiplexer having a first input coupled to an output of the inverter and a second input coupled to a second data output from the memory controller.

In yet another exemplary embodiment, there is provided a method for generating a differential loopback signal for a memory controller. The method may comprise receiving an input data signal, generating an inverted data signal by inverting the input data signal, passing the input data signal through a first multiplexer, passing the inverted data signal through a second multiplexer, and outputting the input data signal and the inverted data signal as a differential signal.

DETAILED DESCRIPTION

Figure 1:
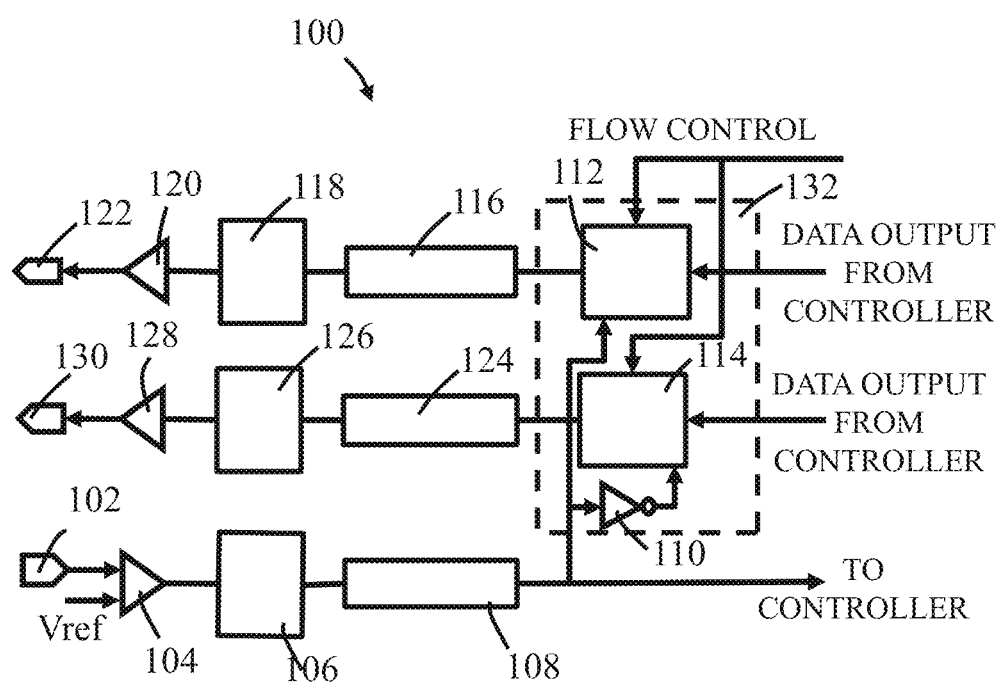
FIG. 1 schematically shows a memory controller with loopback testing circuitry in accordance with an embodiment of the present disclosure.

Specific embodiments according to the present disclosure will now be described in detail with reference to the accompanying figures. Like elements in the various figures are denoted by like reference numerals for consistency.

FIG. 1 schematically shows a memory controller 100 with loopback testing circuitry 132 in accordance with an embodiment of the present disclosure. The memory controller 100 may comprise an input terminal 102 for receiving a data input signal, a receiver 104 coupled to the input terminal 102, a decision feedback equalizer (DFE) 106 coupled to the receiver 104 and an input buffer 108 coupled to the output of the DEF 106. The input terminal 102 may be commonly referred as a DQ pin and the received data input signal may be referred to as a DQ signal. In one embodiment, the input buffer 108 may be implemented as a first-in-first-out (FIFO) buffer, and referred to as a read FIFO buffer or simply read FIFO. Moreover, the input terminal 102, the receiver 104, the DEF 106 and the input buffer 108 may form an input data path. In one embodiment, the input data path may be part of a physical interface (PHY) of the memory controller 100. In some embodiments, the memory controller 100 may be a fifth-generation double data rate (DDR5) memory controller and in at least one embodiment, the memory controller 100 may be a DDR5 memory controller in a System on a Chip (SoC).

The memory controller 100 may further comprise the loopback testing circuitry 132 that may be configured to generate loopback testing signals for the DQ signal. The loopback testing circuitry 132 may comprise an inverter 110, a first multiplexer 112, and a second multiplexer 114. The inverter 110 may be coupled to the output of the input buffer 108 to generate an inverted signal for the DQ signal. The first multiplexer 112 may have a first input coupled to an output of the input buffer 108 and a second input coupled to a first data output from the memory controller 100. The second multiplexer 114 may have a first input coupled to an output of the inverter 110 and a second input coupled to a second data output from the memory controller 100. Both the first multiplexer 112 and the second multiplexer 114 may be controlled by a flow control signal. The flow control signal may determine whether the signals from the first input or the second input of the first multiplexer 112 and the second multiplexer 114 may pass through.

The memory controller 100 may further comprise a first output buffer 116, a first serializer 118, a first output driver 120 and a first output terminal 122. The first output buffer 116 may have an input coupled to the output of the first multiplexer 112 and its output coupled to the first serializer 118. The first output driver 120 may be coupled to the output of the serializer 118 and configured to drive the signal from the multiplexer 112 out on the first output terminal 122. The memory controller 100 may further comprise a second output buffer 124, a second serializer 126, a second output driver 128 and a second output terminal 130. The second output buffer 124 may have an input coupled to the output of the second multiplexer 114 and its output coupled to the second serializer 126. The second output driver 128 may be coupled to the output of the second serializer 126 and configured to drive the signal from the second multiplexer 114 out on the second output terminal 130.

In an implementation example, the original loopback data (e.g., the DQ signal) may be sent to one of the output buffers (e.g., the first output buffer 116), and the inverted loopback data (e.g., the inverted DQ signal) may be sent to another output buffer (e.g., the second output buffer 124). The loopback signal from the first output buffer 116 may be transmitted to the first output driver 120 (via the first serializer 118) while the inverted loopback signal from the second output buffer 124 may be transmitted to the second output driver 128 (via the second serializer 126). Because the signals of the first output driver 120 and the second output driver 128 are fully complementary to each other, a full differential signal may be formed between the output terminals 122 and 130. In one embodiment, the output terminal 122 may be referred to as the positive terminal of the loopback DQ signal and the output terminal 130 may be referred to as the negative terminal of the loopback DQ signal.

In some embodiments, each of the first output buffer 116 and second output buffer 124 may be implemented as a first-in-first-out (FIFO) buffer, and referred to as a write FIFO buffer or simply write FIFO. Moreover, the first output buffer 116, the first serializer 118, the first output driver 120 and the first output terminal 122 may form a first output data path; and the second output buffer 124, the second serializer 126, the second output driver 128 and the second output terminal 130 may form a second output data path. In some embodiments, the first output data path and the second output data path may be part of a physical interface (PHY) of the memory controller 100.

In some embodiments, the loopback testing circuitry 132 may also be part of a physical interface (PHY) of the memory controller 100. In these embodiments, the physical interface (PHY) may include the input data path, the first and second output data paths and the loopback testing circuitry 132.

In some other embodiments, the loopback testing circuitry 132 may be implemented as glue logic between a physical interface of the memory controller 100 and other circuitry of the memory controller 100. In these embodiments, the loopback data flow and testing circuit including the multiplexers may be implemented outside of the physical interface (PHY). The input data from the PHY may be looped back to the multiplexers inside the glue logic. The output data from the memory controller may be multiplexed with the loopback data before being sent to the output buffers of the memory controller PHY. The benefit of this implementation is that the macros of the memory controller PHY and the memory controller can remain unchanged, and the implementation cost and difficulty of the loopback testing circuit may be optimized to a minimum.

In yet some other embodiments, the loopback testing circuitry 132 may be implemented as part of the circuitry of the memory controller 100.

Figure 2:
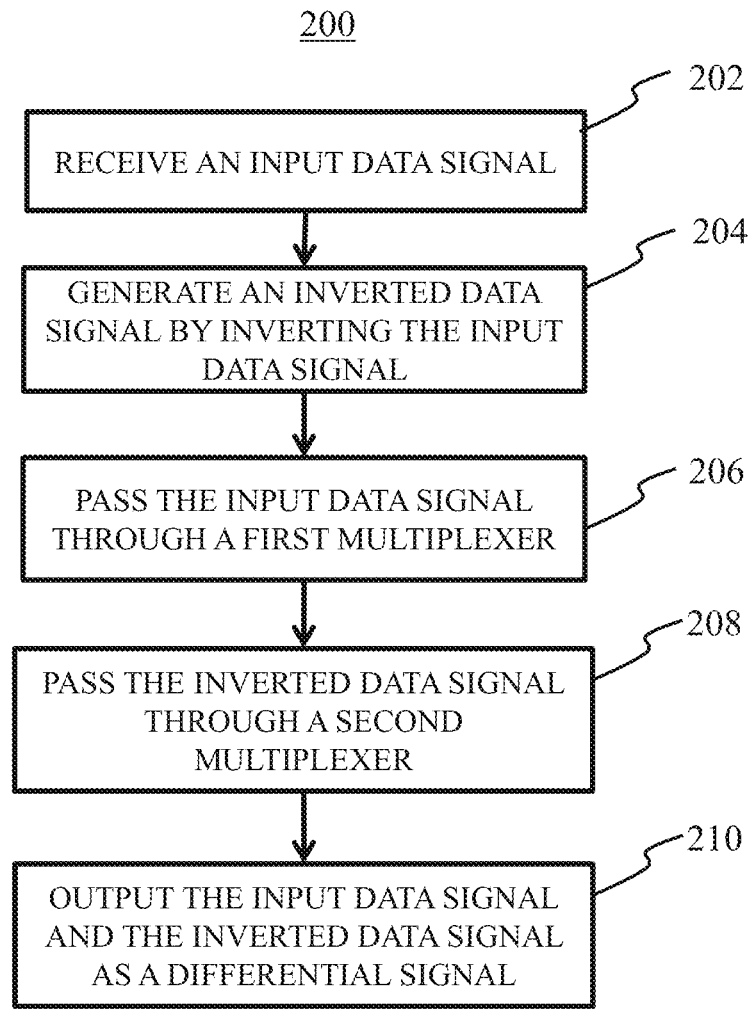
FIG. 2 is a flowchart of a process for generating loopback testing signals for a memory controller in accordance with an embodiment of the present disclosure.

FIG. 2 is a flowchart of a process 200 for generating loopback testing signals for a memory controller in accordance with an embodiment of the present disclosure. At block 202, an input data signal may be received. For example, the receiver 104 coupled to the input terminal 102 memory controller 100 may generate an input data signal by comparing the signal received by the input terminal 102 to a reference voltage Vref. The input data path of the memory controller 100 may further process the received input data signal (e.g., passing through the DFE 106 and put in the input buffer 108). At block 204, an inverted data signal may be generated by inverting the input data signal. For example, the received input data signal may be sent to the inverter 110 and the inverter 110 may generate the inverted data signal by inverting the received input data signal.

At block 206, the input data signal may be passed through a first multiplexer. At block 208, the invented data signal may be passed through a second multiplexer. For example, the received input data signal may be sent to the first multiplexer 112 and the inverted data signal generated by the inverter 110 may be sent to the second multiplexer 114. The first multiplexer 112 and the second multiplexer 114 may be controlled by a flow control signal to let either the loopback test signals pass through or data outputs from the memory controller 100 to pass through. In the process 200, the flow control signal may let the first multiplexer 112 and the second multiplexer 114 to pass through the loopback test signals (e.g., the input data signal and the inverted data signal).

At block 210, the input data signal and the inverted data signal may be output as a differential signal. For example, the received input data signal and the inverted data signal may pass through the first and second output buffers respectively and driven out on respective output terminals 122 and 130. These two loopback test signals may be fully complementary to each other and form a full differential signal to be sent to an external test instrument.

Embodiments of the present disclosure may provide a full differential signal for loopback testing. The full differential signal may provide maximum speed performance and reliability. In comparison, existing loopback testing techniques use single-ended signals, the testing speed is reduced to a half or a quarter of the incoming traffic and only a portion of the received DQ is looped back for comparison. Moreover, embodiments of the present disclosure include not only the receiver circuit and the DFE circuit, but also the read FIFO circuit and the entire transmitter circuit of the memory controller PHY.

In an exemplary embodiment, there is provided a memory controller that may comprise loopback testing circuitry. The loopback testing circuitry may comprise a first multiplexer having a first input coupled to an output of an input buffer and a second input coupled to a first data output from the memory controller, an inverter coupled to the output of the input buffer and a second multiplexer having a first input coupled to an output of the inverter and a second input coupled to a second data output from the memory controller.

In one embodiment, the memory controller may further comprise a physical interface coupled to the loopback testing circuitry. The physical interface may comprise a first driver configured to drive out a data signal from the input buffer and a second driver configured to drive out an inverted data signal from the output of the inverter. The data signal may be a received data signal and the inverted data signal may be the received data signal inverted by the inverter. And the data signal and the inverted data signal may form a differential signal driven out by the first driver and the second driver.

In one embodiment, the physical interface may further include: a decision feedback equalizer (DFE) with an input coupled to a receiver and an output coupled to an input of the input buffer, a first output buffer coupled to an output of the first multiplexer, a first serializer coupled between an output of the first output buffer and an input of the first driver, a second output buffer coupled to an output of the second multiplexer, and a second serializer coupled between an output of the second output buffer and an input of the second driver.

In one embodiment, each of the first output buffer and the second output buffer may be a first-in-first-out (FIFO) buffer.

In one embodiment, the loopback testing circuitry may be part of a physical interface. The physical interface may further comprise: a first driver configured to drive out a data signal from the input buffer and a second driver configured to drive out an inverted data signal from the output of the inverter. The data signal may be a received data signal and the inverted data signal may be the received data signal inverted by the inverter. The data signal and the inverted data signal may form a differential signal driven out by the first driver and the second driver.

In one embodiment, the physical interface may further include: a decision feedback equalizer (DFE) with an input coupled to a receiver and an output coupled to an input of the input buffer, a first output buffer coupled to an output of the first multiplexer, a first serializer coupled between an output of the first output buffer and an input of the first driver, a second output buffer coupled to an output of the second multiplexer, and a second serializer coupled between an output of the second output buffer and an input of the second driver.

In one embodiment, each of the first output buffer and the second output buffer may be a first-in-first-out (FIFO) buffer.

In one embodiment, the input buffer may be a first-in-first-out (FIFO) buffer.

In another exemplary embodiment, there is provided a physical interface for a memory controller. The physical interface may comprise loopback testing circuitry that may comprise a first multiplexer having a first input coupled to an output of an input buffer and a second input coupled to a first data output from the memory controller, an inverter coupled to the output of the input buffer, and a second multiplexer having a first input coupled to an output of the inverter and a second input coupled to a second data output from the memory controller.

In one embodiment, the physical interface may further comprise: a first driver configured to drive out a data signal from the input buffer and a second driver configured to drive out an inverted data signal from the output of the inverter. The data signal may be a received data signal and the inverted data signal may be the received data signal inverted by the inverter. And the data signal and the inverted data signal may form a differential signal driven out by the first driver and the second driver.

In one embodiment, the physical interface may further comprise a decision feedback equalizer (DFE) with an input coupled to a receiver and an output coupled to an input of the input buffer, a first output buffer coupled to an output of the first multiplexer, a first serializer coupled between an output of the first output buffer and an input of the first driver, a second output buffer coupled to an output of the second multiplexer, and a second serializer coupled between an output of the second output buffer and an input of the second driver.

In one embodiment, each of the first output buffer and the second output buffer may be a first-in-first-out (FIFO) buffer.

In one embodiment, the input buffer may be a first-in-first-out (FIFO) buffer.

In yet another exemplary embodiment, there is provided a method for generating a differential loopback signal for a memory controller. The method may comprise receiving an input data signal, generating an inverted data signal by inverting the input data signal, passing the input data signal through a first multiplexer, passing the inverted data signal through a second multiplexer, and outputting the input data signal and the inverted data signal as a differential signal.

In one embodiment, the method may further comprise passing the input data signal through a decision feedback equalizer (DFE) and an input buffer before sending the input data signal to an inverter to generate the inverted data signal and the first multiplexer.

In one embodiment, the first multiplexer may have a first input coupled to an output of the input buffer and a second input coupled to a first data output from the memory controller, and the second multiplexer may have a first input coupled to an output of the inverter and a second input coupled to a second data output from the memory controller.

In one embodiment, the input buffer may be a first-in-first-out (FIFO) buffer.

In one embodiment, the memory controller may comprise a physical interface that comprises a first driver configured to drive out the input data signal and a second driver configured to drive out the inverted data signal. The input data signal and the inverted data signal may form a differential signal driven out by the first driver and the second driver.

In one embodiment, the physical interface may further include: a first output buffer coupled to an output of the first multiplexer, a first serializer coupled between an output of the first output buffer and an input of the first driver, a second output buffer coupled to an output of the second multiplexer, and a second serializer coupled between an output of the second output buffer and an input of the second driver.

In one embodiment, each of the first output buffer and the second output buffer may be a first-in-first-out (FIFO) buffer.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A memory controller, comprising:
    loopback testing circuitry, comprising:
        a first multiplexer having a first input coupled to an output of an input buffer and a second input coupled to a first data output from the memory controller, wherein the input buffer has an input coupled to an output of a decision feedback equalizer (DFE) to receive an input data signal passing through the DFE, and the first multiplexer is controlled by a flow control signal to let either a first data signal from the memory controller or the input data signal from the input buffer to pass through the first multiplexer;
        an inverter coupled to the output of the input buffer to generate an inverted data signal of the input data signal that has passed through the DFE and the input buffer; and
        a second multiplexer having a first input coupled to an output of the inverter and a second input coupled to a second data output from the memory controller, wherein the second multiplexer is controlled by the flow control signal to let either a second data signal from the memory controller or the inverted data signal to pass through the second multiplexer.

2. The memory controller of claim 1, further comprising a physical interface coupled to the loopback testing circuitry, the physical interface comprising: a first driver configured to drive out the input data signal from the input buffer and a second driver configured to drive out the inverted data signal from the output of the inverter, wherein the input data signal and the inverted data signal form a differential signal driven out by the first driver and the second driver.

3. The memory controller of claim 2, wherein the physical interface further includes:
    the decision feedback equalizer (DFE) with an input coupled to a receiver;
    a first output buffer coupled to an output of the first multiplexer;
    a first serializer coupled between an output of the first output buffer and an input of the first driver;
    a second output buffer coupled to an output of the second multiplexer; and
    a second serializer coupled between an output of the second output buffer and an input of the second driver.

4. The memory controller of claim 3, wherein each of the first output buffer and the second output buffer is a first-in-first-out (FIFO) buffer.

5. The memory controller of claim 1, wherein the loopback testing circuitry is part of a physical interface, the physical interface further comprises: a first driver configured to drive out the input data signal from the input buffer and a second driver configured to drive out the inverted data signal from the output of the inverter, wherein the input data signal and the inverted data signal form a differential signal driven out by the first driver and the second driver.

6. The memory controller of claim 5, wherein the physical interface further includes:
    the decision feedback equalizer (DFE) with an input coupled to a receiver;
    a first output buffer coupled to an output of the first multiplexer;
    a first serializer coupled between an output of the first output buffer and an input of the first driver;
    a second output buffer coupled to an output of the second multiplexer; and
    a second serializer coupled between an output of the second output buffer and an input of the second driver.

7. The memory controller of claim 6, wherein each of the first output buffer and the second output buffer is a first-in-first-out (FIFO) buffer.

8. The memory controller of claim 1, wherein the input buffer is a first-in-first-out (FIFO) buffer.

9. A physical interface for a memory controller, comprising:
    loopback testing circuitry, comprising:
        a first multiplexer having a first input coupled to an output of an input buffer and a second input coupled to a first data output from the memory controller, wherein the input buffer has an input coupled to an output of a decision feedback equalizer (DFE) to receive an input data signal passing through the DFE, and the first multiplexer is controlled by a flow control signal to let either a first data signal from the memory controller or the input data signal from the input buffer to pass through the first multiplexer;
        an inverter coupled to the output of the input buffer to generate an inverted data signal of the input data signal that has passed through the DFE and the input buffer; and
        a second multiplexer having a first input coupled to an output of the inverter and a second input coupled to a second data output from the memory controller, wherein the second multiplexer is controlled by the flow control signal to let either a second data signal from the memory controller or the inverted data signal to pass through the second multiplexer.

10. The physical interface of claim 9, further comprising: a first driver configured to drive out the input data signal from the input buffer and a second driver configured to drive out the inverted data signal from the output of the inverter, wherein the input data signal and the inverted data signal form a differential signal driven out by the first driver and the second driver.

11. The physical interface of claim 10, further comprising:
    the decision feedback equalizer (DFE) with an input coupled to a receiver;
    a first output buffer coupled to an output of the first multiplexer;
    a first serializer coupled between an output of the first output buffer and an input of the first driver;
    a second output buffer coupled to an output of the second multiplexer; and
    a second serializer coupled between an output of the second output buffer and an input of the second driver.

12. The physical interface of claim 11, wherein each of the first output buffer and the second output buffer is a first-in-first-out (FIFO) buffer.

13. The physical interface of claim 9, wherein the input buffer is a first-in-first-out (FIFO) buffer.

14. A method for generating a differential loopback signal for a memory controller, comprising:
    receiving an input data signal at a receiver of the memory controller;
    passing the input data signal through a decision feedback equalizer (DFE) and an input buffer;
    generating an inverted data signal at an inverter by inverting the input data signal received through the input buffer and the DFE;

passing the input data signal received through the input buffer and the DFE through a first multiplexer;

passing the inverted data signal through a second multiplexer; and outputting the input data signal and the inverted data signal as a differential signal.

15. The method of claim 14, wherein the first multiplexer has a first input coupled to an output of the input buffer and a second input coupled to a first data output from the memory controller, and the second multiplexer has a first input coupled to an output of the inverter and a second input coupled to a second data output from the memory controller.

16. The method of claim 15, wherein the input buffer is a first-in-first-out (FIFO) buffer.

17. The method of claim 14, wherein the memory controller comprises a physical interface that comprises a first driver configured to drive out the input data signal and a second driver configured to drive out the inverted data signal.

18. The method of claim 17, wherein the physical interface further includes:

a first output buffer coupled to an output of the first multiplexer;

a first serializer coupled between an output of the first output buffer and an input of the first driver;

a second output buffer coupled to an output of the second multiplexer; and a second serializer coupled between an output of the second output buffer and an input of the second driver.

19. The method of claim 18, wherein each of the first output buffer and the second output buffer is a first-in-first-out (FIFO) buffer.

* * * * *